United States Patent
Georgantas et al.

(10) Patent No.: US 8,620,228 B2
(45) Date of Patent: *Dec. 31, 2013

(54) WCDMA TRANSMIT ARCHITECTURE

(75) Inventors: Theodoros Georgantas, Haidari (GR); Konstantinos D. Vavelidis, Ilioupoli (GR); Sofoklis Plevridis, Glyfada (GR); Babis (Charalampos) Kapnistis, Pefki (GR); Spyridon Kavadias, Voula (GR)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/459,546

(22) Filed: Apr. 30, 2012

(65) Prior Publication Data

US 2012/0220244 A1  Aug. 30, 2012

Related U.S. Application Data

(63) Continuation of application No. 13/096,198, filed on Apr. 28, 2011, now Pat. No. 8,170,501, which is a continuation of application No. 12/119,066, filed on May 12, 2008, now Pat. No. 7,953,377.

(60) Provisional application No. 61/042,611, filed on Apr. 4, 2008.

(51) Int. Cl.
*H04B 1/02* (2006.01)

(52) U.S. Cl.
USPC ............................................................ 455/91

(58) Field of Classification Search
USPC ............... 455/73, 76, 91, 101, 102, 103, 108, 455/110, 118, 126, 127.1
See application file for complete search history.

(56) References Cited

U.S. PATENT DOCUMENTS

| | | | |
|---|---|---|---|
| 6,819,910 B2* | 11/2004 | Shi et al. ...................... 455/126 |
| 7,113,757 B2* | 9/2006 | Chu et al. .................. 455/127.1 |
| 2004/0023620 A1* | 2/2004 | Sahota et al. .................. 455/91 |
| 2005/0180360 A1* | 8/2005 | Hansen et al. ................ 455/101 |

* cited by examiner

*Primary Examiner* — Thanh Le
(74) *Attorney, Agent, or Firm* — Garlick & Markison; Shayne X. Short

(57) ABSTRACT

Wideband-Code Division Multiple Access (W-CDMA) transmit architecture. A baseband digital processing module operates cooperatively with an analog signal processing module to effectuate highly adjustable and highly accurate gain adjustment in accordance with transmitter processing within a communication device. The gain adjustment and/or gain control is partitioned between the digital and analog domains by employing two cooperatively operating digital and analog modules, respectively. Gain adjustment in the analog domain is performed in a relatively more coarse fashion that in the digital domain. If desired, gain adjustment in each of the analog and digital domains is performed across a range of discrete steps. The discrete steps in the analog domain are larger than the discrete steps in the digital domain. Also, the discrete steps in the digital domain may be interposed between two successive discrete steps in the analog domain.

20 Claims, 7 Drawing Sheets

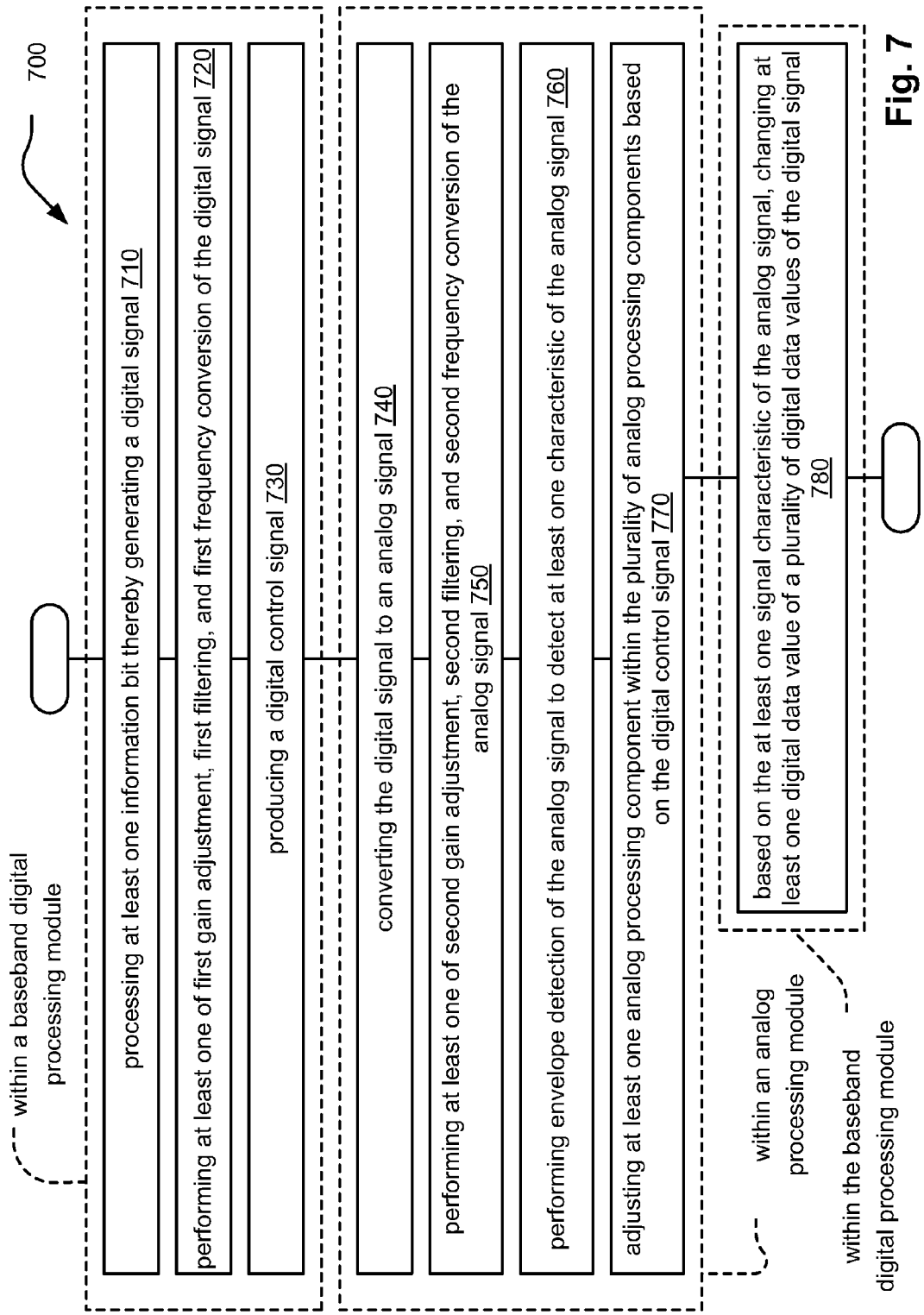

WCDMA TRANSMIT ARCHITECTURE

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:
  1. U.S. Utility patent application Ser. No. 13/096,198, entitled "WCDMA transmit architecture," filed Apr. 28, 2011, pending, pending, and scheduled to be issued as U.S. Pat. No. 8,170,501 on May 1, 2012 (as indicated in an ISSUE NOTIFICATION mailed on Apr. 11, 2012), which claims priority pursuant to 35 U.S.C. §120, as a continuation, to the following U.S. Utility patent application which is hereby incorporated herein by reference in its entirety and made part of the present U.S. Utility patent application for all purposes:
    2. U.S. Utility patent application Ser. No. 12/119,066, entitled "WCDMA transmit architecture," filed May 12, 2008, now issued as U.S. Pat. No. 7,953,377 on May 31, 2011, which claims priority pursuant to 35 U.S.C. §119(e) to the following U.S. Provisional Patent Application which is hereby incorporated herein by reference in its entirety and made part of the present U.S. Utility patent application for all purposes:
      2.1. U.S. Provisional Patent Application Ser. No. 61/042,611, entitled "WCDMA transmit architecture," filed Apr. 4, 2008, now expired.

BACKGROUND OF THE INVENTION

Technical Field of the Invention

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera, communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered (optionally) to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

Within the transmitter portions of typical prior art devices, the gain adjustment of a signal that is ultimately transmitted (e.g., a radio frequency (RF) output signal) is typically performed exclusively within the analog domain. The control of any analog gain associated components is also typically performed exclusively within the analog domain within prior art communication devices. Oftentimes, this incurs the need for one or more analog transmit RF filter modules to perform the appropriate filtering within this prior art, analog architecture. A more complex and/or congested analog architecture typically and inherently results in a noisier analog cell within a communication device and/or integrated circuit. For example, in typical prior art architectures that are relatively more complex in nature, the use of one or more analog transmit RF filter modules, among other possible additional modules, may be needed to compensate for the relatively increased noise intrinsic to such prior art, complex and/or congested analog architectures.

In addition, because of the nature of such an analog architecture, such transmitters suffer from poor gain stability over temperature, process, and/or power supply variations. This prior art approach makes it very difficult to implement any transmitter design that is not susceptible to these deleterious effects. Also, the very nature of such prior art approaches has a high sensitivity to noise. Also, in some prior art embodiments, there may be no power savings within such a prior art communication device when it operates with relatively lower output power levels. Moreover, given the inherently coupled nature of components within such prior art analog architectures, there can be great difficulty in the independent adjustment of components therein. Setting any gain value with a relatively high degree of accuracy can be virtually impossible within such prior art architectures. As a result, the transmit signal accuracy of such prior art architectures suffers significantly from in-phase/quadrature (I, Q) gain and phase errors.

There exists a need in the art for a means by which better transmitter architectures may be implemented within communication devices (including wireless communication devices).

BRIEF DESCRIPTION OF THE SEVERAL VIEWS OF THE DRAWINGS

FIG. 7 is a diagram illustrating an embodiment of a method for operating a communication device that includes a baseband digital processing module and an analog signal processing module.

DETAILED DESCRIPTION OF THE INVENTION

A novel architecture and means is presented herein by which gain adjustment and/or control within a transmitter of a communication device is partitioned between the digital and analog domains by employing two cooperatively operating digital and analog modules, respectively. The transmitter may be implemented using a complementary metal-oxide-semiconductor (CMOS) process. The digital section thereof accepts a digital input signal (e.g., an information bit/sequence) and produces an analog output signal (e.g., a radio frequency (RF) output signal) capable to be transmitted from the communication device via a communication channel. The analog section thereof accepts the I, Q signal (e.g., the digital signal generated from within the digital section) and produces the analog output signal in accordance with a selected protocol and band pair.

For example, such a communication device implemented in accordance with certain aspects of the invention can be a multi-protocol and multi-band capable communication device that operates in accordance with a first protocol and band pair during a first time and in accordance with a second protocol and band pair during a second time. For example, when operating in accordance with the first protocol and band pair, the analog signal generated by the communication device has a first frequency, and when operating in accordance with the second protocol and band pair, the analog signal generated by the communication device has a second frequency.

In one embodiment, such an apparatus implemented in accordance with certain aspects of the invention includes a baseband digital processing module that operates cooperatively with an analog signal processing module to effectuate highly adjustable and highly accurate gain adjustment in accordance with transmitter processing within a communication device.

The gain control for such a transmitter module may be performed entirely in the digital domain. Gain adjustment in the analog domain is performed in a relatively more coarse fashion than in the digital domain. If desired, gain adjustment in each of the analog and digital domains is performed across a range of discrete steps. The discrete steps in the analog domain are larger than the discrete steps in the digital domain. Also, the discrete steps in the digital domain may be interposed between two successive discrete steps in the analog domain.

This all digital gain control design and coarse/fine gain adjustment in the analog/digital domains provides for an architecture that is relatively much more stable than prior art designs over a wide range of temperature, process, and/or power supply variations. This also provides for a much easier to calibrate architecture than prior art approaches. Moreover, this novel architecture and means presented herein also allows for independent adjustment of linearity and output noise.

Figure 1:
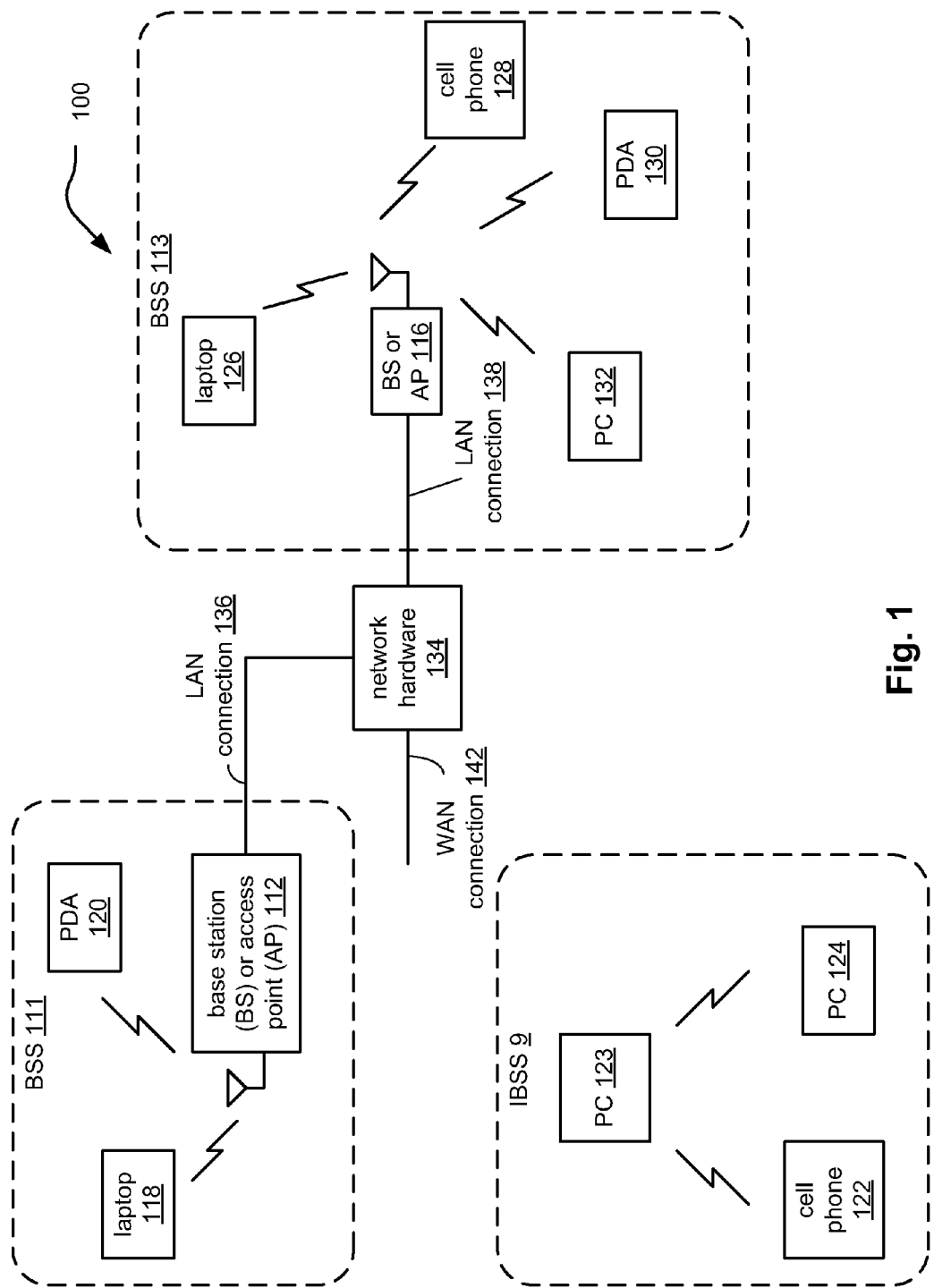
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera, provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
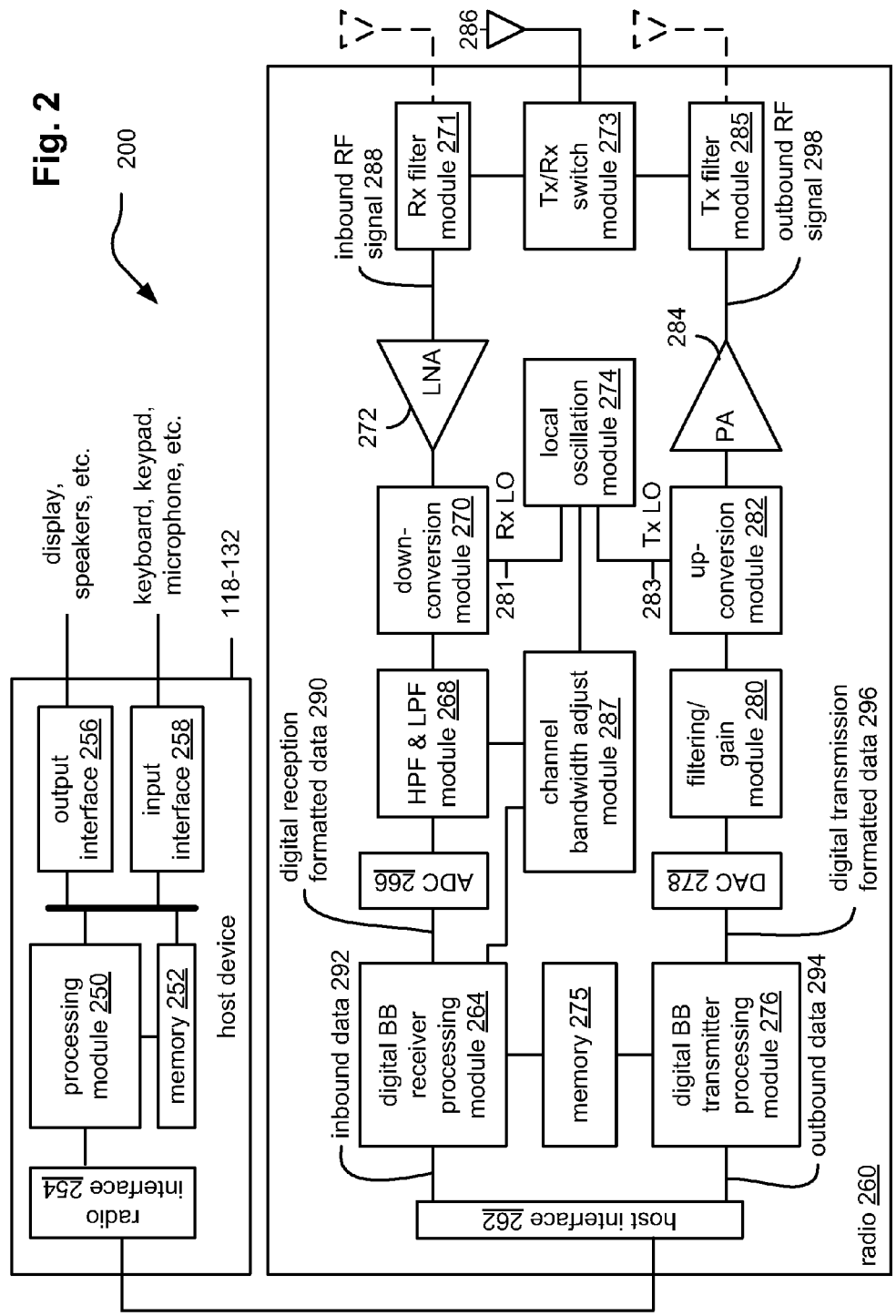
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera, such that the received data may be displayed. The radio interface 254 also provides data from the processing module 250 to the radio 260. The processing module 250 may receive the outbound data from an input device such as a keyboard, keypad, microphone, et cetera, via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

Figure 3:
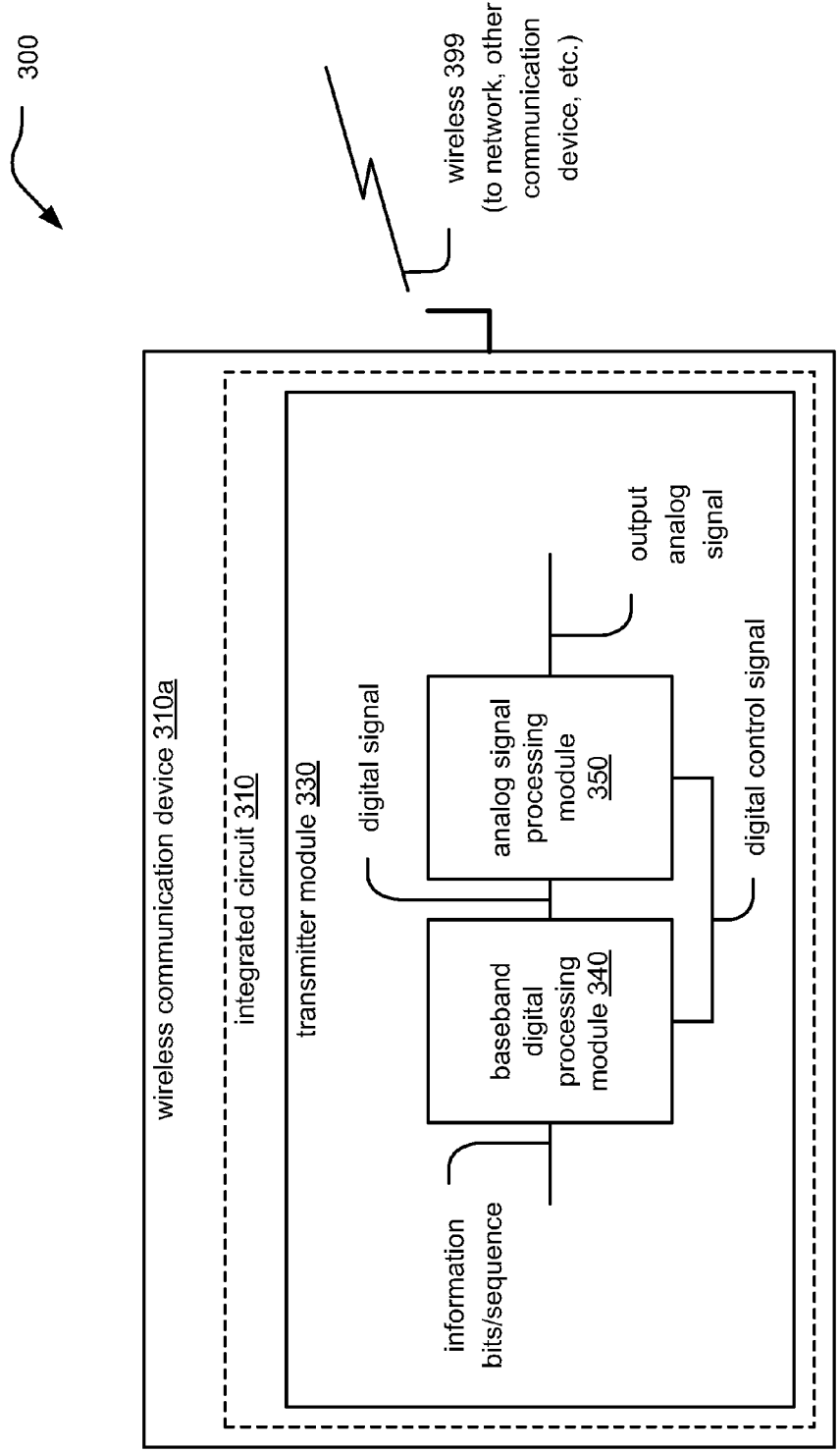
FIG. 3 is a diagram illustrating an alternative embodiment of a wireless communication system including a wireless communication device that includes a baseband digital processing module and an analog signal processing module.

FIG. 3 is a diagram illustrating an alternative embodiment of a wireless communication system 300 including a wireless communication device 310a that includes a baseband digital processing module 340 and an analog signal processing module 350.

The wireless communication device 310a can communicate via a wireless communication channel 399 to a communication network and/or one or more other communication devices. The wireless communication device 310a includes transmitter module 330 for generating an output analog signal (e.g., a radio frequency (RF) output signal) that can be transmitted via a communication channel.

The baseband digital processing module 340 and the analog signal processing module 350 may be implemented within an integrated circuit 310 (or alternatively within more than one integrated circuit) within the wireless communication device 310a.

A digital input signal which may be viewed as an information bit stream/sequence is provided to the baseband digital processing module 340. The baseband digital processing module 340 generates a digital signal (e.g., I, Q components thereof) and passes this digital signal to the analog signal processing module 350 from which an output analog signal is output (e.g., an RF output signal). In addition, the transmitter module 330 employs all digital gain control, in that, any analog components within the analog signal processing module 350 may be adjusted/configured based on a digital control signal provided by the baseband digital processing module 340.

While gain adjustment and/or gain control is described with reference to many of the embodiments described herein, it is also noted that additional operations including filtering and/or frequency conversion may be performed cooperatively using the baseband digital processing module 340 and the analog signal processing module 350.

Figure 4:
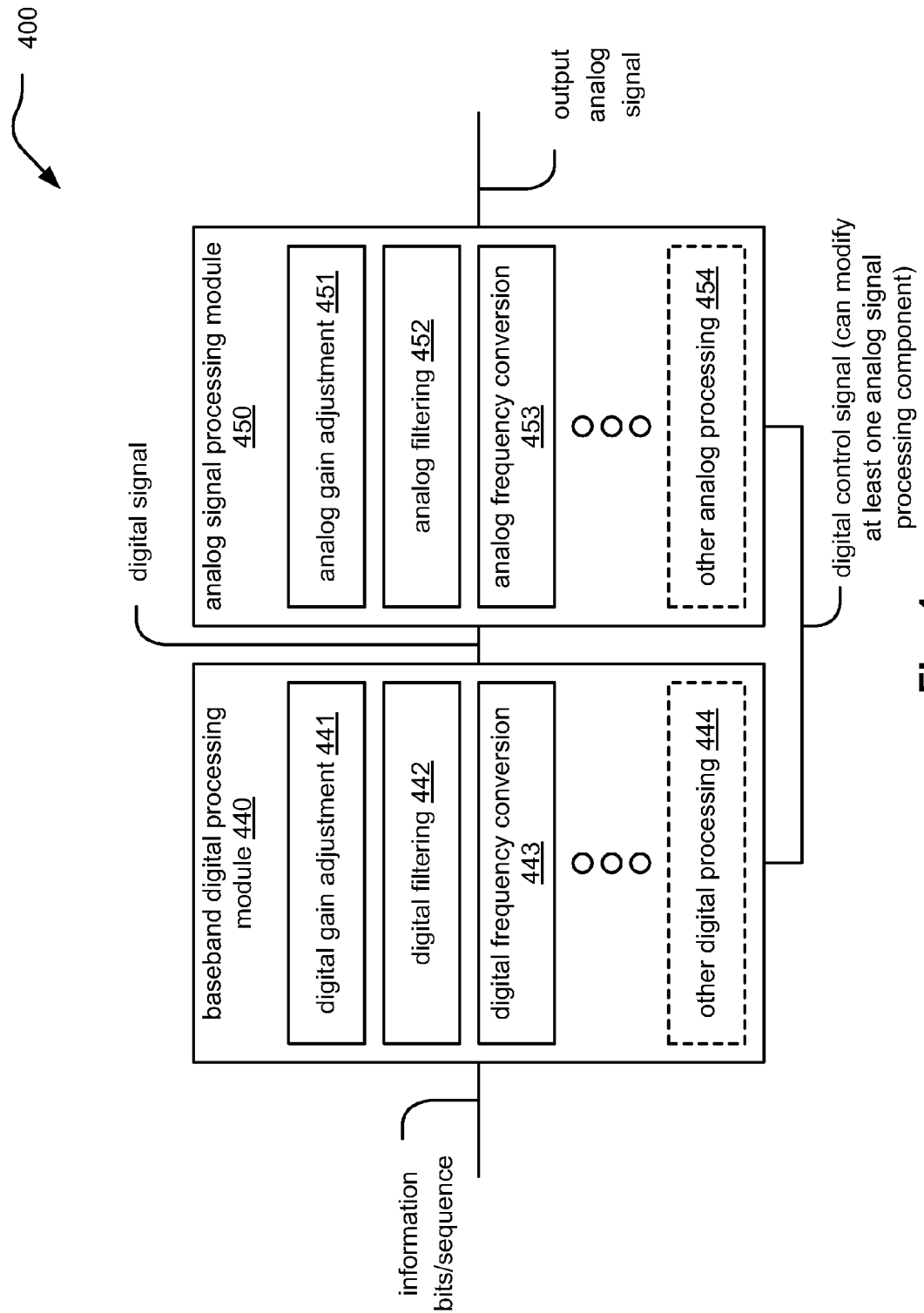
FIG. 4 is a diagram illustrating an embodiment of an apparatus that includes a baseband digital processing module and an analog signal processing module.

FIG. 4 is a diagram illustrating an embodiment of an apparatus 400 that includes a baseband digital processing module and an analog signal processing module. In this embodiment, a digital input signal which may be viewed as an information bit stream/sequence is provided to a baseband digital processing module 440. The baseband digital processing module 440 generates a digital signal (e.g., I, Q components thereof) and passes this digital signal to an analog signal processing module 350 from which an output analog signal is output (e.g., an RF output signal).

In addition, this apparatus 400 employs all digital gain control, in that, any analog components within the analog signal processing module 450 may be adjusted/configured based on a digital control signal provided by the baseband digital processing module 440.

The baseband digital processing module 440 is capable to perform any one or more of digital gain adjustment 441, digital filtering 442, digital frequency conversion 443, and/or any other digital processing 444 on the information bit stream/sequence. It is noted that the digital processing performed herein includes actually modifying digital data values of the information bit stream/sequence received by the baseband digital processing module 440.

The analog signal processing module 450 is capable to perform any one or more of analog gain adjustment 451, analog filtering 452, analog frequency conversion 453, and/or any other analog processing 454 on the received digital signal (after converting it to an analog signal within the analog signal processing module 450 (e.g., using a digital to analog converter (DAC) or other means)).

Figure 5:
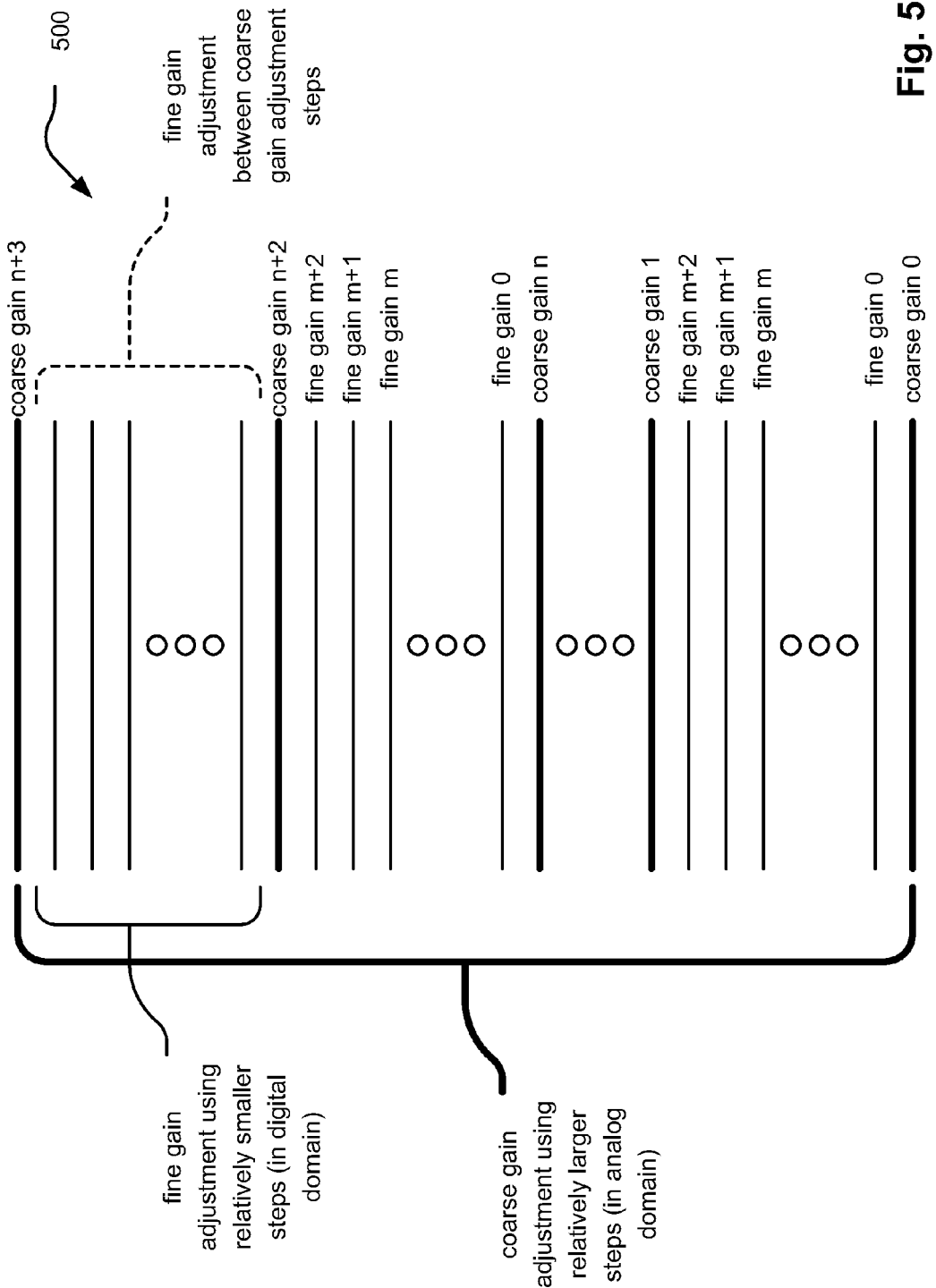
FIG. 5 is a diagram illustrating an embodiment of coarse and fine gain adjustment being performed in the analog and digital domains.

FIG. 5 is a diagram illustrating an embodiment 500 of coarse and fine gain adjustment being performed in the analog and digital domains. As can be seen relatively coarse gain adjustment is performed using relatively larger steps in the analog domain. In between the coarse gain steps, relatively finer gain adjustment is performed using relatively smaller steps in the digital domain.

In some embodiments, the digital gain adjustment is performed between two successive coarse gain steps using the digital gain adjustment.

Figure 6:
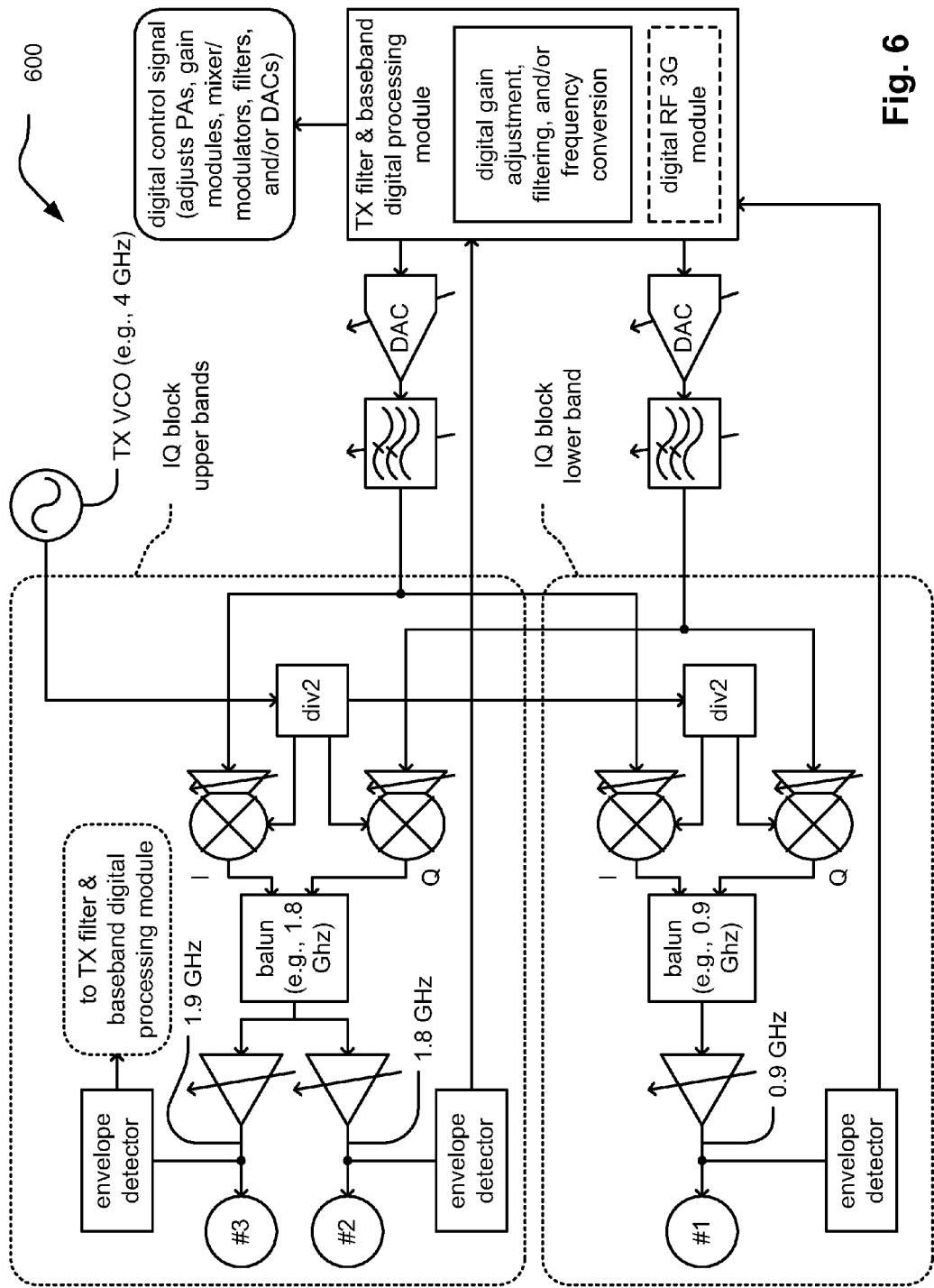
FIG. 6 is a diagram illustrating an embodiment of transmitter module, as can be implemented within a communication device, that includes digital and analog sections operating cooperatively to generate at least one output signal.

FIG. 6 is a diagram illustrating an embodiment of transmitter module 600, as can be implemented within a communication device, that includes digital and analog sections operating cooperatively to generate at least one output signal. The transmitter modules includes a transmit (TX) filter (e.g., which may be implemented as a root-raised cosine (RRC) filter in desired embodiments, but may generally be implemented using any desired type of filter) and baseband digital processing module. The TX filter and baseband digital processing module is capable to adjust digital values of a received digital signal to effectuate digital gain adjustment, filtering, and/or frequency conversion. The TX filter and baseband digital processing module can also include an integrated digital RF 3G module to effectuate.

There are a wide variety of communication system contexts in which this transmitter module 600 of this embodiment, or any other embodiment depicted herein, may be implemented including those that operate in accordance with different protocols and/or bands. Some examples of various RATs (Radio Access Technologies) include Global System for Mobile Communications (GSM), Enhanced Data Rates for GSM Evolution (EDGE), Code Division Multiple Access (CDMA), Wideband-Code Division Multiple Access (W-CDMA), UTRA-UTRAN Long Term Evolution (LTE), WiMAX (Worldwide Interoperability for Microwave Access), WiFi/WLAN (Wireless Local Area Network), ZigBee, Bluetooth, Ultra-Wide Band (UWB), and/or other types and variations thereof.

A digital signal is output from the TX digital filter and baseband digital processing module. This digital signal is provided to two separate digital to analog converters (DACs) from which analog signals are output there from. After passing through two analog filters, these signals are then passed appropriately to mixer/modulators, whose frequency conversion is controlled by the outputs of respective divider modules (shown as div 2), that are themselves controlled by a TX voltage controlled oscillator (VCO) that operates to provide a desired frequency signal (e.g., shown as 4 GHz in this embodiment, but which may be any desired frequency). Each respective mixer/modulator provides an I component or a Q component that is output and provided to a corresponding balun. A selected gain module, of a number of gain modules, then outputs a respective analog output signal. These signals are shown as analog output signal #1, analog output signal #2, and analog output signal #3. Each of these as analog output signals can have different properties and be in compliance with a different protocol and band pair (e.g., those any one of those described above).

A corresponding envelope detector is implemented to monitor each of the output analog signals and to provide such monitored information to the TX filter and baseband digital processing module. It is noted that this monitoring may be performed in any number of ways, including (1) in real time, (2) during production testing, or (3) during the powering-up of the device and/or integrated circuit that includes the transmitter module 600, among other ways.

Based on this monitored information provided to the TX filter and baseband digital processing module, the TX filter and baseband digital processing module can modify the data values of any digital signal processed therein. In addition, the TX filter and baseband digital processing module can provide any one or more digital control signals to adjust any operational parameter of any power amplifier (PA), gain module, mixer/modulator, filter, and/or DAC implemented within the transmitter module 600. That is to say, one or more of the various components within the transmitter module 600 are adjustable/configurable.

FIG. 7 is a diagram illustrating an embodiment of a method 700 for operating a communication device that includes a baseband digital processing module and an analog signal processing module. It is noted that the analog signal processing module can include one of more components that are adjustable/configurable.

Within the baseband digital processing module, the method 700 operates by processing at least one information bit thereby generating a digital signal, as shown in a block 710. Within the baseband digital processing module, the method 700 operates performing at least one of first gain adjustment, first filtering, and first frequency conversion of the digital signal, as shown in a block 720. Within the baseband digital processing module, the method 700 operates producing a digital control signal, as shown in a block 730.

Within the analog signal processing module, the method 700 operates by performing at least one of second gain adjustment, second filtering, and second frequency conversion of the analog signal, as shown in a block 750. Within the analog signal processing module, the method 700 operates by performing envelope detection of the analog signal to detect at least one characteristic of the analog signal, as shown in a block 760.

Within the analog signal processing module, the method 700 operates by adjusting at least one analog processing component within the plurality of analog processing components based on the digital control signal, as shown in a block 770.

Within the baseband digital processing module of the integrated circuit, based on the at least one signal characteristic of the analog signal, the method 700 also involves changing at least one digital data value of a plurality of digital data values of the digital signal, as shown in a block 780.

It is noted that the various modules (e.g., baseband processing modules, transmitter modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a digital signal processor to generate a digital control signal based on at least one characteristic of a digital signal; and
an analog signal processor to process at least one additional digital signal corresponding to the digital signal with operation adjustable and controllable by the digital control signal to generate an analog output signal in accordance with a protocol and band pair selected from a plurality of protocol and band pairs.

2. The apparatus of claim 1, wherein:
the digital signal processor to process the digital signal by modifying at least one digital data value thereof to generate the at least one additional digital signal; and
the analog signal processor to process the at least one additional digital signal to generate an analog output signal.

3. The apparatus of claim 1, wherein:
the analog signal processor including a plurality of circuitry portions respectively to process a plurality of digital signals output from the digital signal processor; and
each of the plurality of circuitry portions to process a respective one of the plurality of digital signals.

4. The apparatus of claim 1, wherein:
the apparatus is multi-protocol and multi-band capable in accordance with the plurality of protocol and band pairs;
the apparatus is operative in accordance with a first protocol and band pair selected from the plurality of protocol and band pairs during a first time; and
the apparatus is operative in accordance with a second protocol and band pair selected from the plurality of protocol and band pairs during a second time.

5. The apparatus of claim 1, wherein:
the apparatus is a wireless communication device.

6. An apparatus, comprising:
a digital signal processor to generate a digital control signal based on at least one characteristic of a digital signal; and
an analog signal processor to process at least one additional digital signal corresponding to the digital signal with operation adjustable and controllable by the digital control signal.

7. The apparatus of claim 6, wherein:
the digital signal processor to process the digital signal to generate the at least one additional digital signal; and
the analog signal processor to process the at least one additional digital signal to generate an analog output signal.

8. The apparatus of claim 6, wherein:
the digital signal processor to process the digital signal by modifying at least one digital data value thereof to generate the at least one additional digital signal; and
the analog signal processor to process the at least one additional digital signal to generate an analog output signal.

9. The apparatus of claim 6, wherein:
the analog signal processor including a plurality of circuitry portions respectively to process a plurality of digital signals output from the digital signal processor; and
each of the plurality of circuitry portions to process a respective one of the plurality of digital signals.

10. The apparatus of claim 6, wherein:
the apparatus is multi-protocol and multi-band capable in accordance with a plurality of protocol and band pairs; and
the analog signal processor to process the at least one additional digital signal to generate an analog output signal in accordance with a protocol and band pair selected from the plurality of protocol and band pairs.

11. The apparatus of claim 6, wherein:
the apparatus is multi-protocol and multi-band capable in accordance with a plurality of protocol and band pairs;
the apparatus is operative in accordance with a first protocol and band pair selected from the plurality of protocol and band pairs during a first time; and
the apparatus is operative in accordance with a second protocol and band pair selected from the plurality of protocol and band pairs during a second time.

12. The apparatus of claim 6, wherein:
the apparatus is an integrated circuit.

13. The apparatus of claim 6, wherein:
the apparatus is a wireless communication device.

14. A method for operating a communication device, the method comprising:
generating a digital control signal based on at least one characteristic of a digital signal; and
processing at least one additional digital signal corresponding to the digital signal with operation adjustable and controllable by the digital control signal.

15. The method of claim 14, further comprising:
processing the digital signal to generate the at least one additional digital signal; and
processing the at least one additional digital signal to generate an analog output signal.

16. The method of claim 14, further comprising:
processing the digital signal by modifying at least one digital data value thereof to generate the at least one additional digital signal; and
processing the at least one additional digital signal to generate an analog output signal.

17. The method of claim 14, further comprising:
operating a digital signal processor to generate the digital control signal based on the at least one characteristic of a digital signal; and
operating an analog signal processor to process the at least one additional digital signal corresponding to the digital signal with operation adjustable and controllable by the digital control signal; and
operating a plurality of circuitry portions of the analog signal processor respectively to process a plurality of digital signals output from the digital signal processor such that each of the plurality of circuitry portions processing a respective one of the plurality of digital signals.

18. The method of claim 14, further comprising:
the communication device is multi-protocol and multi-band capable in accordance with a plurality of protocol and band pairs; and further comprising:
processing the at least one additional digital signal to generate an analog output signal in accordance with a protocol and band pair selected from the plurality of protocol and band pairs.

19. The method of claim 14, wherein:
the communication device is multi-protocol and multi-band capable in accordance with a plurality of protocol and band pairs; and further comprising:
operating the communication device in accordance with a first protocol and band pair selected from the plurality of protocol and band pairs during a first time; and
operating the communication device in accordance with a second protocol and band pair selected from the plurality of protocol and band pairs during a second time.

20. The method of claim 14, wherein:
the communication device is a wireless communication device.

* * * * *